(12) United States Patent
Bailey (10) Patent No.: US 9,461,456 B2
(45) Date of Patent: Oct. 4, 2016

(54) INTEGRATED SWITCHBOARD FOR A MODULAR DATA CENTER

(71) Applicant: Dell Products, LP, Round Rock, TX (US)

(72) Inventor: Mark M. Bailey, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 413 days.

(21) Appl. No.: 14/055,019

(22) Filed: Oct. 16, 2013

(65) Prior Publication Data

US 2015/0103455 A1   Apr. 16, 2015

(51) Int. Cl.
  *H02J 1/00*   (2006.01)
  *H02H 3/08*   (2006.01)
  *G06F 1/18*   (2006.01)

(52) U.S. Cl.
  CPC ............... *H02H 3/08* (2013.01); *G06F 1/189* (2013.01)

(58) Field of Classification Search
  USPC ........................................ 361/63; 307/29, 70
  See application file for complete search history.

(56) References Cited

U.S. PATENT DOCUMENTS

| | | |
|---|---|---|
| 7,667,855 B2 | 2/2010 | Piazza |
| 2001/0001051 A1* | 5/2001 | Cratty .................... H02J 3/005 429/432 |
| 2011/0208622 A1 | 8/2011 | Gopisetty et al. |
| 2012/0249588 A1 | 10/2012 | Tison et al. |
| 2012/0313963 A1 | 12/2012 | Chen-Quee et al. |
| 2013/0082820 A1 | 4/2013 | Tieman |
| 2013/0254849 A1 | 9/2013 | Alison et al. |
| 2013/0293017 A1* | 11/2013 | Englert .................... H02J 9/04 307/65 |
| 2015/0103455 A1* | 4/2015 | Bailey .................... G06F 1/189 361/63 |

* cited by examiner

*Primary Examiner* — Ronald W Leja
(74) *Attorney, Agent, or Firm* — Larson Newman, LLP (57) ABSTRACT

A modular data center includes a first module that provides a first function of the mobile data center, a second module operable that provides a second function of the mobile data center, and an integrated switchboard having first and second protection devices and a switch. The integrated switchboard receives a high-capacity power feed, protects the high-capacity power feed from a first over-current condition with the first protection device to provide a load feed to a load associated with the first module, provides the high-capacity power feed to an input of the switch, and protects an output of the switch from a second over-current condition with the second protection device to provide a load feed to a load associated with the second module.

20 Claims, 4 Drawing Sheets

INTEGRATED SWITCHBOARD FOR A MODULAR DATA CENTER

FIELD OF THE DISCLOSURE

This disclosure relates generally to modular data centers, and more particularly relates to a high capacity integrated switchboard for a modular data center.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software resources that may be configured to process, store, and communicate information and may include one or more computer systems, data storage systems, and networking systems.

A group of information handling systems may be included in a data center. A modular data center is a portable version of a data center that provides an easily expandable computing capacity that is quick to set up and to get operational, without having the building construction and infrastructure typically associated with a traditional data center. A modular data center includes a power distribution network for providing power to the information handling systems, to environmental conditioning equipment such as HVAC units and air handlers, and to other auxiliary loads. Power is typically provided to a modular data center via a separate dead-front switchboard that includes high-voltage power source connections for providing multiple switched and protected power feeds to the modular data center to power the information handling systems, the environmental conditioning equipment, and other power loads of the modular data center. Underwriters Laboratories (UL) provides a standard (Standard UL891) for switchboards and switch gear.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources. In particular, while the teachings are provided in the context of a modular data center, the power needs of the modular data center are to be considered as exemplary, and the teachings can be applied to other types of power loads.

For purpose of this disclosure an information handling system can be implemented on one or more information handling system. An information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

Figure 1:
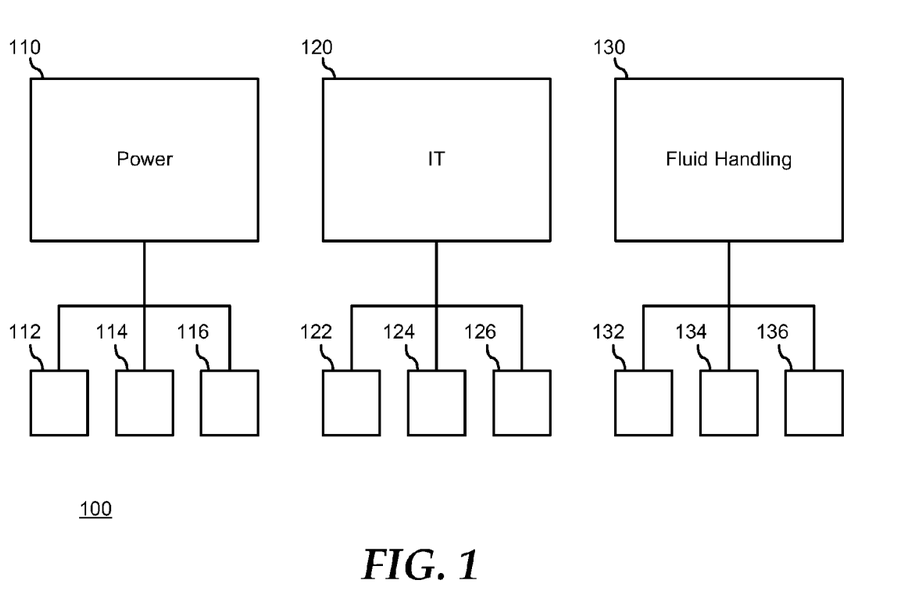
FIG. 1 is a block diagram of a modular data center according to an embodiment of the present disclosure.

FIG. 1 illustrates an embodiment of a modular data center 100 including a power module 110, an IT module 120, and a fluid handling module 130. In a particular embodiment, modular data center 100 represents a movable data center that is manufactured and assembled in a manufacturing location and shipped to a remote location for deployment and use. Modular data center 100 can include additional modules as needed or desired. Each of power module 110, IT module 120, and fluid handling module 130 comprise one or more sub-modules that can be manufactured separately and can be assembled to the respective module at the manufacturing location or can be shipped to the remote location for assembly to the respective module. As such, power module 110 includes sub-modules 112, 114, and 116. For example, sub-modules 112, 114, and 116 can include sub-modules for an uninterruptible power supply (UPS), for battery back-up, for auxiliary power generation, for power distribution and switching, or for other power functions, as needed or desired. Similarly, IT module 120 includes sub-modules 122, 124, and 126. For example, sub-modules 122, 124, and 126 can include sub-modules for adding to the computing power of modular data center 100, such as by adding sub-modules with added racks of information handling systems, storage systems, switching and routing systems, networking systems, or the like. Also, fluid handling module 130 includes sub-modules 132, 134, and 136, such as sub-modules for air conditioning equipment, fans, heaters, air-flow control, or other fluid handling systems, as needed or desired.

Power module 110, IT module 120, and fluid handling module 130 may be combined in a variety of configurations, each configuration dependant upon the operational requirement of the modular data center. For example, fluid handling module 130 can include an air mover attached to the top of IT module 120. Fluid handling module 130 can also include elements attached to the bottom or sides of the module, or free standing elements can be connected to the IT module through pipes. Likewise, power module 110 can be deployed as a structural enclosure separate from IT module 120 and fluid handling module 130, and can be attached to the IT module and the fluid handling module via power cables. As such, modular data center 100 can take a variety of shapes and sizes and allows for a wide variety of design alternatives and footprints.

Each of modules 110, 120, and 130 can be separately configurable, such that each module may be designed and configured as its own isolated system, according to the overall operational and environmental requirements of modular data center 100 or a subset of the operational and environmental requirements of the modular data center. The operational and environmental requirements of modular data center 100 can include, for example, the space available to deploy the modular data center, the power available at the remote location, the amount of computing power required, local building and power code requirements, the climatic conditions of the remote location where the modular data center is to be deployed, and the type of information handling system to be utilized in the modular data center. Separately configuring each of modules 110, 120, and 130 can also include selecting between pre-designed configurations for each module according to the operational and environmental requirements. Sub-modules 112, 114, 116, 122, 124, 126, 132, 134, and 136 can each include one or more of the pre-designed configurations that can each be configured according to the design needs of the corresponding module 110, 120, or 130.

Figure 2:
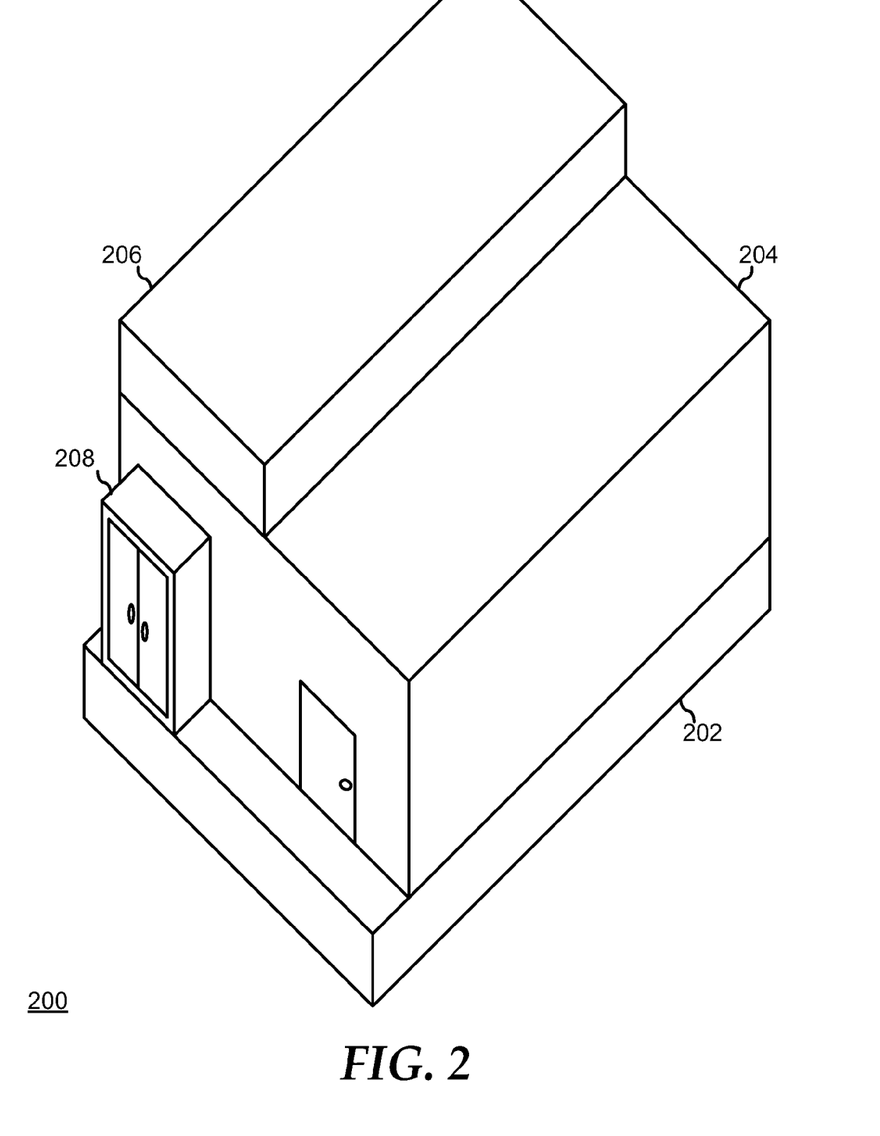
FIG. 2 is an exterior view of a modular data center according to an embodiment of the present disclosure.

FIG. 2 illustrates an embodiment of a modular data center 200 similar to modular data center 100 and including a foundation frame 202, an IT module 204 similar to IT module 120, a fluid handling module 206 similar to fluid handling module 130, and an integrated switchboard 208. In a particular embodiment, foundation frame 202 includes one or more elements of a power module similar to power module 110, and integrated switchboard 208 includes one or more additional elements of a power module. In particular, integrated switchboard 208 represents a dead-front switchboard that is attached to, and integrated with modular data center 200 and operates to receive a small number of high-capacity power feeds, to provide protection for the high-capacity power feeds, to switch the high-capacity power feeds to a number of individual load power feeds of the modular data center, and to provide protection to the load power feeds. In a particular embodiment, integrated switchboard 208 includes an interface to a building maintenance system (BMS) to provide control information to and status information from the integrated switchboard. For example, integrated switchboard 208 can include a digital programmable logic controller (PLC) that provides control signals to the various elements of the integrated switchboard and receives status information, such as switch positions, breaker statuses, load statuses, environmental status, and other status information. In a particular embodiment, the PLC operates to provide control and status information for the other elements of modular data center 200, such as for IT module 204 and for fluid handling module 206.

In a particular embodiment, integrated switchboard 208 is manufactured in accordance with one or more manufacturing and assembly codes, performance standards, and industry ratings. For example, an enclosure for integrated switchboard 208 can be constructed in accordance with a National Electronics Manufacturers Association (NEMA) enclosure rating, such as a NEMA3R enclosure that is intended for outdoor use, that provides a degree of protection against falling rain and ice formation, and that meets various NEMA rod entry, rain, external icing, and rust-resistance design tests. In another example, integrated switchboard 208 can include electrical equipment that is in conformance with one or more electrical standards such as the National Electrical Code (NEC), the Canadian Electrical Code (CEC), the International Electrical Code (IEC), or another electrical code or standard. In yet another example, integrated switchboard 208 can be assembled in accordance with one or more switchboard standards, such as the UL891 Standard for Switchboards, or another switchboard standard.

In a particular embodiment, integrated switchboard 208 receives a small number of high-capacity power feeds. For example the high-capacity power feeds can provide 400 Volts (V) alternating current (AC), 480 V AC, or another voltage level, and can provide high current levels, such as 800 amps (A), 1600 A, 2000 A, 2400 A, or another high current level. As such, the switches, breakers, connectors, and other equipment in integrated switchboard 208 can be commercially available products with common voltage and current ratings that are in conformance with one or more of the manufacturing and assembly codes, performance standards, and industry ratings as noted above. In a particular embodiment, integrated switchboard 208 provides a number of individual load power feeds of modular data center 200 that are at a same voltage level as the high-capacity power feeds. Here, the load power feeds are protected by lower current breakers or current interrupters, such that the power provided to the elements of modular data center 200 that receive power from the load power feeds is lower than the full capacity of the high-capacity power feeds. For example, the load power feeds can be protected against over-currents of 100 A, 200 A, 400 A, or another current level, as needed or desired. In another embodiment, integrated switchboard 208 operates to provide a voltage level change between the high-capacity power feeds and one or more of the load power feeds. For example, integrated switchboard 208 can include a transformer to level shift a high-capacity power feed voltage level of 400 V or 480 V to one or more load power feeds at 200 V or 220 V. In a particular embodiment, one or more of the high-capacity power feeds or one or more of the load power feeds provide three-phase AC power. In a particular embodiment, integrated switchboard 208 operates to provide one or more of the high-capacity power feeds as alternate sources for powering one or more of the load power feeds. For example, a particular load power feed, such as a load power feed to fluid handling module 206, can be provided with power from a selected one of two or more high-capacity power feeds. Here, integrated switchboard 208 can include one or more automatic transfer switches (ATS) for directing the power from a selected one of two high-capacity power feeds to a particular load power feed, as needed or desired.

Integrated switchboard 208 is integrated with the other elements of modular data center 200, such as with foundation frame 202, IT module 204, and fluid handling module 206. In a particular embodiment, integrated switchboard 208 is integrated with the other elements at the manufacturing location and is shipped to the remote location as an integrated assembly that forms all or part of modular data center 200. In another embodiment, integrated switchboard 208 is manufactured as a sub-module at the manufacturing location and is sent to the remote location for integration with the other elements of modular data center 200. In either embodiment, integrated switchboard 208 is designed and constructed to be integral with modular data center 200. For example, integrated switchboard 208 can be attached to the top or side of foundation frame 202, can be attached to IT module 204 or to fluid handling module 206, or to another element of modular data center 200, as needed or desired. Integrated switchboard 208 thus enables modular data center 200 to be easily integrated with existing high-capacity power feeds at the remote location, without requiring preconditioning of the high-capacity power feeds into separate load power feeds for the modular data center, thereby cutting down on the necessity for switching and protection equipment to be prepared at the remote location.

Figure 3:
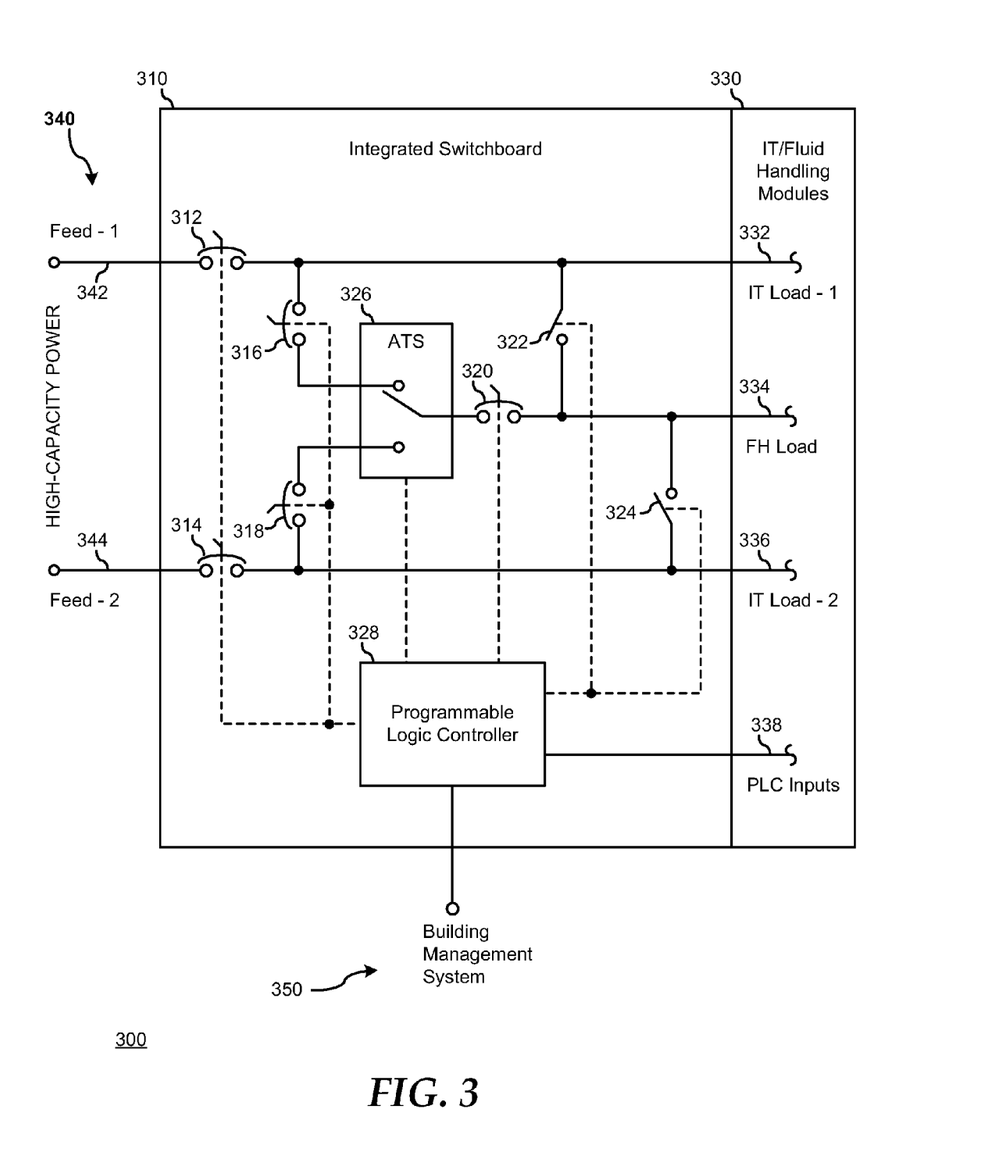
FIG. 3 is a schematic diagram of a power system for a modular data center according to an embodiment of the present disclosure.

FIG. 3 illustrates an embodiment of a power system 300 for a modular data center similar to modular data centers 100 and 200, including an integrated switchboard 310, and an IT/fluid handling module 330. Integrated switchboard 310 is similar to integrated switchboard 208. IT/fluid handling module 330 incorporates features similar to IT modules 120 and 204 and to fluid handling modules 130 and 206. Power system 300 receives high-capacity power 340 by connecting the power system to a first high-capacity power feed 342 and to a second high-capacity power feed 344. Control and status information for power system 300 is provided by connecting the power system to BMS 350. Integrated switchboard 310 receives the high-capacity power from high-capacity power feeds 342 and 344, and provides power to a first IT load 332, to a fluid handling load 334, and to a second IT load 336. Integrated switchboard 310 is configured such that power from first high-capacity power feed 342 is supplied to first IT load 332, power from second high-capacity load feed 344 is supplied to second IT load 336, and power from a selected one of the first and second high-capacity power feeds is supplied to fluid handling load 334.

As such, integrated switchboard 310 includes breakers 312, 314, 316, 318, and 320, switches 322 and 324, and an ATS 326. Breakers 312, 314, 316, 318, and 320, and switches 322 and 324 each include two terminals. ATS 326 includes two input terminals and a switched output terminal. High-capacity power feed 342 is connected to the first terminal of breaker 312, and the second terminal of breaker 312 is connected to the first terminal of breaker 316, to the first terminal of switch 322, and to first IT load 332. High-capacity power feed 344 is connected to the first terminal of breaker 314, and the second terminal of breaker 314 is connected to the first terminal of breaker 318, to the first terminal of switch 324, and to second IT load 336. The second terminal of breaker 316 is connected to the first input terminal of ATS 326, and the second terminal of breaker 318 is connected to the second input terminal of the ATS. The output terminal of ATS 326 is connected to the first terminal of breaker 320. The second terminal of breaker 320 is connected to the second terminal of switch 322, to the second terminal of switch 324, and to fluid handling load 334.

High-capacity power feeds 342 and 344 can provide 400 V AC, 480 V AC, or another voltage level, and can provide high current levels, such as 800 A, 1600 A, 2000 A, 2400 A, or another high current level. As such, breakers 312 and 314 can be rated to provide protection that is rated for the associated high current level, as needed or desired. IT loads 332 and 336, and fluid handling load 334 can have designed load levels that are less than the current levels associated with high-capacity power feeds 342 and 344, such as 100 A, 200 A, 400 A, or another current level, as needed or desired. Thus breakers 316, 318, and 320 can be rated to provide protection that is rated for the associated load current levels.

As such, when breakers 312, 314, 316, 318, and 320 are all closed and switches 322 and 324 are open, power from high-capacity power feed 342 is provided directly to first IT load 332 and is protected by breaker 312, and power from high-capacity power feed 344 is provided directly to second IT load 336 and is protected by breaker 314. Further, power from one of high-capacity power feeds 342 or 344 are provided to fluid handling load 334, depending on the state of ATS 326. In a first state, ATS 326 operates to connect power from high-capacity feed 342 to fluid handling load 334, and is protected by breakers 316 and 320. In a second state, ATS 326 operates to connect power from high-capacity feed 344 to fluid handling load 334, and is protected by breakers 318 and 320. In a particular embodiment, breakers 316, 318, and 320 can be separate throws of a common circuit breaker. ATS 326 can operate in various modes. In a first mode, ATS 326 remains preferably in one of the first state or the second state, as needed or desired, and only switches to the other state in response to a fault or another switching condition. In another mode, ATS 326 can operate based on a timing function, periodically switching between the first state and the second state in order to balance the load on high-capacity power feeds 342 and 342. Switches 322 and 324 operate to bypass ATS 326 such that one of high-capacity power feeds 342 or 344 can be used to provide power directly to fluid handling load 334. In a particular embodiment, one or more of IT loads 332 and 336, and fluid handling load 334 are protected by additional breakers (not illustrated), such that one or more of the loads are protected to a lower current level than is provided by breakers 312 and 314.

PLC 328 is connected to breakers 312, 314, 316, 318, and 320, to switches 322 and 324, to ATS 326, and to PLC inputs 338 from IT/fluid handling module 330. PLC 328 operates to determine the status of the devices connected to the PLC, and to provide control information to the devices. For example, PLC 328 can determine status information for breakers 312, 314, 316, 318, and 320, for switches 322 and 324, and for ATS 326, and can provide the status information to BMS 350 such that an operator can remotely see the status for each element of integrated switchboard 310. Further, PLC 328 can provide control information from BMS 350 to breakers 312, 314, 316, 318, and 320, to switches 322 and 324, and to ATS 326. For example, the operator can open selected breakers or switches, or ATS 326 can be provided with controls to periodically change state. PLC 326 also operates to communicate status and control information to the elements of IT/fluid handling module 330, as needed or desired.

The skilled artisan will understand that power system 300 is illustrative of a generalized power system for a modular data center, and that the number of high-capacity power feeds of the generalized power system can be greater than or less than the two high capacity power feeds illustrated herein, as needed or desired. Moreover, the number of load power feeds of the generalized power system can be greater than or less than the three load power feeds illustrated herein, as needed or desired. Further, the number and positions of breakers, switches, and other devices of the generalized power system are not intended to be constrained by the illustrative embodiment of FIG. 3, but other configurations of breakers, switches, and other devices of the generalized power system can be implemented as needed or desired.

Figure 4:
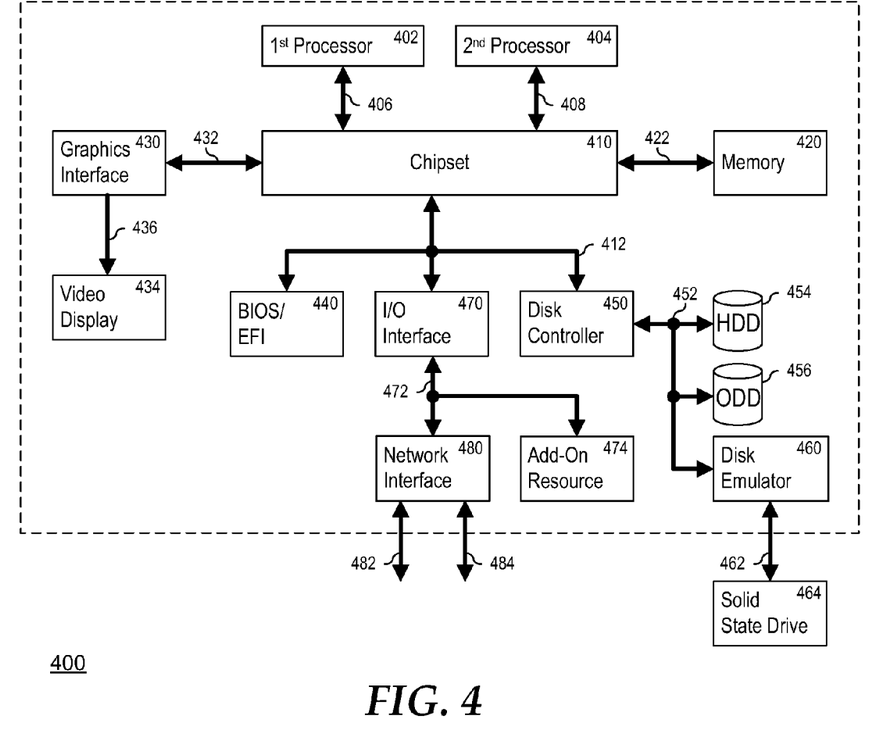
FIG. 4 is a block diagram illustrating a generalized information handling system according to an embodiment of the present disclosure.

FIG. 4 illustrates a generalized embodiment of information handling system 400. For purpose of this disclosure information handling system 400 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described above, and operates to perform one or more of the methods described above. Information handling system 400 includes a processors 402 and 404, a chipset 410, a memory 420, a graphics interface 430, include a basic input and output system/extensible firmware interface (BIOS/EFI) module 440, a disk controller 450, a disk emulator 460, an input/output (I/O) interface 470, and a network interface 480. Processor 402 is connected to chipset 410 via processor interface 406, and processor 404 is connected to the chipset via processor interface 408. Memory 420 is connected to chipset 410 via a memory bus 422. Graphics interface 430 is connected to chipset 410 via a graphics interface 432, and provides a video display output 436 to a video display 434. In a particular embodiment, information handling system 400 includes separate memories that are dedicated to each of processors 402 and 404 via separate memory interfaces. An example of memory 420 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 440, disk controller 450, and I/O interface 470 are connected to chipset 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 440 includes BIOS/EFI code operable to detect resources within information handling system 400, to provide drivers for the resources, initialize the resources, and access the resources. BIOS/EFI module 440 includes code that operates to detect resources within information handling system 400, to provide drivers for the resources, to initialize the resources, and to access the resources.

Disk controller 450 includes a disk interface 452 that connects the disc controller to a hard disk drive (HDD) 454, to an optical disk drive (ODD) 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits a solid-state drive 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O interface 470 includes a peripheral interface 472 that connects the I/O interface to an add-on resource 474 and to network interface 480. Peripheral interface 472 can be the same type of interface as I/O channel 412, or can be a different type of interface. As such, I/O interface 470 extends the capacity of I/O channel 412 when peripheral interface 472 and the I/O channel are of the same type, and the I/O interface translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as chipset 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A modular data center comprising:
    a first module;
    a second module; and
    an integrated switchboard comprising:
        a first protection device;
        a second protection device; and
        a first switch;
    wherein the integrated switchboard is operable to:
        receive a first high-capacity power feed;
        protect the first high-capacity power feed from a first over-current condition with the first protection device to provide a first load feed to a first load associated with the first module;
        provide the first high-capacity power feed to a first input of the first switch; and
        protect an output of the first switch from a second over-current condition with the second protection device to provide a second load feed to a second load associated with the second module.

2. The modular data center of claim 1, further comprising: a foundation frame, wherein the first module and the integrated switchboard are attached to the foundation frame.

3. The modular data center of claim 2, wherein:
    the integrated switchboard further comprises a third protection device;
    the integrated switchboard is further operable to:
        receive a second high-capacity power feed;
        protect the second high-capacity power feed from a third over-current condition with the third protection device to provide a third load feed to a third load associated with the first module; and
        provide the second high-capacity power feed to a second input of the first switch; and
    the first switch operates to selectively couple one of the first high-capacity power feed and the second high-capacity power feed to the second load.

4. The modular data center of claim 3, wherein the integrated switchboard further comprises:
    a second switch operable to bypass the first switch to couple the first high-capacity power feed to the second load; and
    a third switch operable to bypass the first switch to couple the second high-capacity power feed to the second load.

5. The modular data center of claim 3, wherein the first switch comprises an automatic transfer switch.

6. The modular data center of claim 5, wherein in selectively coupling one of the first high-capacity power feed and the second high-capacity power feed to the second load, the automatic transfer switch operates to periodically switch between coupling the first high-capacity power feed to the second load, and coupling the second high-capacity power feed to the second load.

7. The modular data center of claim 2, wherein the first high-capacity power feed comprises a three-phase power feed of at least 400 volts alternating current.

8. The modular data center of claim 7, wherein:
    the first protection device provides a current protection of at least 800 amps; and
    the second protection device provides a current protection of at least 200 amps.

9. The modular data center of claim 1, wherein:
    the integrated switchboard further comprises a third protection device;
    the integrated switchboard is further operable to:
        receive a second high-capacity power feed;
        protect the second high-capacity power feed from a third over-current condition with the third protection device to provide a third load feed to a third load associated with the first module; and
        provide the second high-capacity power feed to a second input of the first switch; and
    the first switch operates to selectively couple one of the first high-capacity power feed and the second high-capacity power feed to the second load.

10. The modular data center of claim 9, wherein:
    the integrated switchboard further comprises:
        a second switch operable to bypass the first switch to couple the first high-capacity power feed to the second load; and
        a third switch operable to bypass the first switch to couple the second high-capacity power feed to the second load.

11. The modular data center of claim 9, wherein:
    the first switch comprises an automatic transfer switch; and
    selectively coupling one of the first high-capacity power feed and the second high-capacity power feed to the second load, the automatic transfer switch operates to periodically switch between coupling the first high-capacity power feed to the second load, and coupling the second high-capacity power feed to the second load.

12. The modular data center of claim 9, wherein:
    the first high-capacity power feed comprises a three-phase power feed of at least 400 volts alternating current;
    the first protection device provides a current protection of at least 800 amps; and the second protection device provides a current protection of at least 200 amps.

13. The modular data center of claim 1, wherein:
the first high-capacity power feed comprises a three-phase power feed of at least 400 volts alternating current;
the first protection device provides a current protection of at least 800 amps; and
the second protection device provides a current protection of at least 200 amps.

14. The modular data center of claim 1, wherein the integrated switchboard further comprises a programmable logic controller coupled to the first protection device, the second protection device, and the first switch.

15. The modular data center of claim 14, wherein the programmable logic controller is operable to:
determine a first status for the first protection device;
determine a second status for the second protection device;
determine a third status for the third protection device; and
control the first switch to couple the first high-capacity power feed to the second load.

16. The modular data center of claim 1, wherein the integrated switchboard comprises a switchboard that conforms to an Underwriters Laboratory Standard UL891.

17. A switchboard comprising:
a first protection device;
a second protection device; and
a first switch;
wherein the switchboard is operable to:
receive a first high-capacity power feed;
protect the first high-capacity power feed from a first over-current condition with the first protection device to provide a first load feed to a first load associated with a first module;
provide the first high-capacity power feed to a first input of the first switch; and
protect an output of the first switch from a second over-current condition with the second protection device to provide a second load feed to a second load associated with a second module.

18. The switchboard of claim 17, wherein:
the switchboard further comprises a third protection device;
the switchboard is further operable to:
receive a second high-capacity power feed;
protect the second high-capacity power feed from a third over-current condition with the third protection device to provide a third load feed to a third load associated with the first module; and
provide the second high-capacity power feed to a second input of the first switch; and
the first switch operates to selectively couple one of the first high-capacity power feed and the second high-capacity power feed to the second load.

19. The switchboard of claim 17, further comprising a programmable logic controller coupled to the first protection device, the second protection device, and the first switch, wherein the programmable logic controller is operable to:
determine a first status for the first protection device;
determine a second status for the second protection device;
determine a third status for the third protection device; and
control the first switch to couple the first high-capacity power feed to the second load.

20. An enclosure comprising:
a first protection device;
a second protection device; and
a first switch;
wherein the enclosure is operable to:
receive a first high-capacity power feed;
protect the first high-capacity power feed from a first over-current condition with the first protection device to provide a first load feed to a first load associated with a first module;
provide the first high-capacity power feed to a first input of the first switch; and
protect an output of the first switch from a second over-current condition with the second protection device to provide a second load feed to a second load associated with a second module; and
wherein the enclosure is attached to a modular data center.

* * * * *